United States Patent [19]
Gilmer et al.

[11] Patent Number: 5,907,780
[45] Date of Patent: May 25, 1999

[54] INCORPORATING SILICON ATOMS INTO A METAL OXIDE GATE DIELECTRIC USING GAS CLUSTER ION BEAM IMPLANTATION

[75] Inventors: Mark C. Gilmer, Austin; Mark I. Gardner, Cedar Creek, both of Tex.

[73] Assignee: Advanced Micro Devices, Inc.

[21] Appl. No.: 09/098,704

[22] Filed: Jun. 17, 1998

[51] Int. Cl.⁶ .................................................. H01L 21/336
[52] U.S. Cl. ............................................................ 438/299
[58] Field of Search ................................... 438/299, 197, 438/144, 158, 167

[56] References Cited

U.S. PATENT DOCUMENTS

| | | |
|---|---|---|
| 4,120,700 | 10/1978 | Morimoto . |
| 4,559,096 | 12/1985 | Friedman et al. . |
| 4,929,489 | 5/1990 | Dreschhoff et al. . |
| 5,070,046 | 12/1991 | Hu . |
| 5,111,355 | 5/1992 | Anand et al. . |
| 5,142,438 | 8/1992 | Reinberg et al. . |
| 5,186,718 | 2/1993 | Tepman et al. . |
| 5,246,884 | 9/1993 | Jaso et al. . |
| 5,281,554 | 1/1994 | Shimada et al. . |
| 5,304,503 | 4/1994 | Yoon et al. . |
| 5,552,337 | 9/1996 | Kwon et al. . |
| 5,677,015 | 10/1997 | Hasegawa . |

OTHER PUBLICATIONS

Huang, et al, "The Influence of Ge–Implantation on the Electrical Characteristics of the Ultra–Shallow Junction Formed by Using Silicide as a Diffusion Source," IEEE Electron Device Letters, vol. 17, No. 3, Mar. 1996, pp. 88–90.

Yamada et al. "Gas Cluster Ion Beam Processing for ULSI Fabrication," Reprinted from Materials Research Society Symposium Proceedings vol. 427, *Advanced Metallization for Future ULSI*. No Date.

Raaijamakers "Low Temperature Metal—Organic Chemical Vapor Deposition of Advanced Barrier Layers for the Microelectronics Industry," *Thin Solid Films,* 247 (1994) pp. 85–93.

*Primary Examiner*—Charles Bowers
*Assistant Examiner*—Craig Thompson
*Attorney, Agent, or Firm*—Kevin L. Daffer; Conley, Rose & Tayon

[57] ABSTRACT

An integrated circuit fabrication process is provided for forming silicon dioxide in the vacancies of a gate dielectric comprising metal oxide. The gate dielectric has a relatively high dielectric constant to promote high capacitive coupling between two conductive layers separated by the gate dielectric. The gate dielectric may be used in, e.g., a MOS transistor device or an EEPROM memory cell. The silicon dioxide is formed within the gate dielectric by first incorporating silicon atoms within the gate dielectric using gas cluster ion beam implantation. Gas cluster ion beam implantation affords shallow implantation of the silicon atoms. The gate dielectric is then annealed in a diffusion furnace while being exposed to a steam- or oxygen-bearing ambient. As a result of being heated, Si atoms react with O atoms to form $SiO_2$ which fills oxygen vacancies in the gate dielectric. Absent the oxygen vacancies, the gate dielectric is less likely to allow current to leak between the two conductive layers. The $SiO_2$ serves to terminate dangling bonds within the gate dielectric so that hot carriers and foreign species are substantially inhibited from being trapped within the gate dielectric.

15 Claims, 6 Drawing Sheets

INCORPORATING SILICON ATOMS INTO A METAL OXIDE GATE DIELECTRIC USING GAS CLUSTER ION BEAM IMPLANTATION

BACKGROUND OF THE INVENTION

1. Field of the Invention

This invention relates to integrated circuit fabrication and, more particularly, to incorporating silicon atoms into a high K dielectric using gas cluster ion beam implantation. The high K dielectric is annealed to form silicon dioxide from the silicon atoms to enhance the quality of the high K dielectric.

2. Description of the Related Art

Various devices within an integrated circuit employ a gate dielectric interposed between two layers composed of semiconductive or conductive materials. For example, the gate dielectric may be interposed between a polycrystalline silicon ("polysilicon") gate conductor and a silicon-based substrate in a well-known MOSFET transistor device. The gate dielectric may also be placed between a polysilicon control gate and a polysilicon floating gate in a well-known FLOTOX EEPROM memory device. The gate dielectric of a circuit device serves to isolate the overlying and underlying materials while also permitting capacitive coupling between those materials.

It has been necessary to increase the capacitances of integrated circuit devices in order to meet the high demand for faster and more complex circuits. The capacitance is dependent upon the thickness of the gate dielectric and the relative permittivity of the gate dielectric. Decreasing the thickness of the gate dielectric gives rise to an increase in the capacitance. Permittivity, $\epsilon$, of a material reflects the ability of the material to be polarized by an electric field. Therefore, capacitance between two layers of conductive material separated by a dielectric is directly proportional to the permittivity of the dielectric. The permittivity of a material is typically described as its permittivity normalized to the permittivity of a vacuum, $\epsilon_0$. Hence, the relative permittivity or dielectric constant, K, of a material is defined as:

$$K=\epsilon/\epsilon_0$$

While decreasing the thickness of the gate dielectric effectuates increased capacitive coupling between two conductive layers, it has several disadvantages. For instance, relatively thin gate dielectrics tend to break down when subjected to an electric field. Electrons may pass through the thin gate dielectric by what is known as the quantum mechanical tunneling effect. As a result, a tunneling current may inadvertently flow between the two conductive layers. On the other hand, a dielectric having a relatively high K value may be formed to a greater thickness and still provide for the same amount of capacitance as a thinner dielectric having a lower K value. Accordingly, dielectrics having relatively high K values are growing in popularity for use as gate dielectrics in integrated circuit devices.

Metal oxides which have high K values (e.g., K>8.0), such as tantalum pentoxide, may be used as the gate dielectric. The metal oxide is typically formed using chemical-vapor deposition ("CVD"). Unfortunately, a CVD deposited metal oxide is typically not stoichiometric and contains oxygen vacancies. For example, $Ta_2O_5$ formed by the CVD method may contain molecules having 3 or 4 oxygen atoms instead of 5 oxygen atoms. Absent the appropriate number of oxygen atoms, molecules within the metal oxide may include dangling bonds to which foreign atoms can undesirably bond. Further, the oxygen vacancies within the metal oxide may provide migration pathways through the gate dielectric. Foreign atoms may thus pass through the gate dielectric between the overlying and underlying conductive layers. For example, dopants residing within an overlying gate conductor may be able to diffuse through the gate dielectric to an underlying semiconductor substrate where they can render the device inoperable. The vacancies in the gate dielectric also function as carrier-bodies for leakage current, and thereby cause the gate dielectric to have a low breakdown voltage. Moreover, the oxygen vacancies may serve as traps for hot carriers (e.g., electrons) injected into the gate dielectric. As the trapped charge accumulates over time, the capacitance of a device employing the gate dielectric may unfortunately shift from its design specification.

It would therefore be of benefit to develop a high K gate dielectric which experiences little current leakage and has a high breakdown voltage. That is, a gate dielectric is needed which provides for high capacitive coupling between two conductive layers separated by the gate dielectric while also having a low breakdown voltage. Further, it would be desirable to form a gate dielectric in which hot carrier entrapment is less likely to occur. Moreover, the migration of species through the gate dielectric must be prevented to ensure that foreign species do not enter the overlying and underlying conductive layers. In particular, the amount of oxygen vacancies within the gate dielectric needs to be reduced to prevent hot carrier entrapment and current leakage in the gate dielectric, and to prevent the diffusion of species through the gate dielectric.

SUMMARY OF THE INVENTION

The problems outlined above are in large part solved by the technique hereof for forming silicon dioxide in the vacancies of a gate dielectric comprising metal oxide. The gate dielectric has a relatively high dielectric constant (e.g., K>8.0) to promote high capacitive coupling between two conductive layers separated by the gate dielectric. The gate dielectric is deposited across an underlying semiconductive or conductive layer of material using chemical-vapor deposition. As such, the as-deposited gate dielectric may be non-stoichiometric and may include oxygen vacancies. The silicon dioxide is formed within the gate dielectric by first incorporating silicon atoms within the gate dielectric using gas cluster ion beam implantation. The gate dielectric is then annealed in a diffusion furnace while being exposed to a steam- or oxygen-bearing ambient. As a result of being heated, Si atoms react with O atoms to form $SiO_2$ which fills oxygen vacancies in the gate dielectric. Absent the oxygen vacancies, the gate dielectric is less likely to allow breakdown to occur between the two conductive layers. The $SiO_2$ serves to terminate dangling bonds within the gate dielectric so that hot carriers and foreign species are substantially inhibited from being trapped within the gate dielectric. Further, the presence of the $SiO_2$ within the vacancies of the gate dielectric blocks diffusion pathways through the gate dielectric so that foreign atoms are substantially inhibited from passing between the two conductive layers. Also, the $SiO_2$ increases the compatibility (or mechanical bond strength) between the gate dielectric and the silicon nitride layer.

Gas cluster ion beam implantation involves supercooling a gas by passing it through a super sonic expansion nozzle into a high vacuum chamber. As a result of being supercooled, cluster beams comprising hundreds to thousands of atoms may be generated from molecules in the gas. Those clusters of atoms are then ionized to form cluster ion beams which are passed through an ion accelerator, i.e., an electric field. The ion accelerator causes the ionized clusters of atoms to gain energy as they are directed toward a target. As the ionized clusters of atoms bombard the target, they separate into individual atoms which share the total energy of the corresponding cluster. Dividing the total energy of a cluster among individual atoms results in the energy of each atom being much lower than the entire cluster. In fact, the energy of each atom may range from a few eV to hundreds of eV. The relatively low energy of the each atom affords shallow implantation of the atoms into the target material. As such, gas cluster ion beam implantation may be used to accurately implant atoms to a depth of 5 to 100 Å below a topological surface.

Accordingly, gas cluster ion implantation may be used to accurately place silicon atoms at a pre-determined depth within a gate dielectric even if the thickness of the gate dielectric is relatively shallow. While it is possible to diffuse silicon atoms into the gate dielectric from, e.g., an underlying silicon-based substrate, a concentration gradient of silicon atoms across the substrate interface may cause electrical performance fluctuations across the gate dielectric. Advantageously, implanting the silicon atoms allows them to be placed uniformly throughout a pre-selected region of the gate dielectric as opposed to being placed more concentrated in some areas than in others. Using gas cluster ion implantation therefore affords better control over where the silicon atoms come to rest in the gate dielectric than does diffusing the silicon atoms into the gate dielectric.

According to an embodiment, a gate dielectric is formed within a MOSFET transistor device between a silicon-based substrate and a gate conductor. Prior to the formation of the gate dielectric, a relatively thin layer of silicon nitride ("nitride") is CVD deposited across the substrate using, e.g., remote plasma CVD or jet vapor CVD. The nitride layer may subsequently serve as a diffusion barrier which substantially prevents foreign species from migrating into the underlying substrate. Thereafter, a dielectric comprising a metal oxide having a K value greater than about 8.0 is CVD deposited across the nitride layer. An appropriate metal oxide for the gate dielectric includes, but is not limited to, tantalum pentoxide ($Ta_2O_5$), barium titanate ($BaTiO_3$), titanium oxide ($TiO_2$), zirconium oxide ($ZrO_2$), barium zirconate ($BaZrO_3$), barium tungstate ($BaWO_4$), magnesium dioxide ($MnO_2$), magnesium tungstate ($MnWO_4$), strontium niobate ($Sr_2Nb_2O_7$), tungsten trioxide ($WO_3$), zinc tungstate ($ZnWO_4$) yttrium sesqeioxide ($Y_2O_3$), strontium tungstate ($SrWO_4$), and strontium titanate ($SrTiO_3$).

The deposition of the nitride layer and the gate dielectric comprising metal oxide may be performed consecutively within the same reaction chamber. The reaction chamber is preferably maintained under vacuum between each deposition so that the semiconductor topography is not exposed to ambient oxygen and other contaminants in the interim. Preferably, the gate dielectric comprises tantalum pentoxide which has a K value of about 22–25. Using high K dielectric materials for the gate dielectric provides for high gate-to-substrate capacitance without requiring the thickness of the gate dielectric to be decreased. Advantageously, a layer of tantalum pentoxide having a thickness which is about 4–5 times greater than a layer of silicon dioxide will exhibit the same capacitance as the layer of silicon dioxide. As such, the thickness of a high K gate dielectric may be made sufficiently large to provide for low breakdown voltage of the dielectric.

Subsequently, silicon atoms are incorporated into the gate dielectric using gas cluster ion beam implantation. The gate dielectric is then annealed in a furnace while it is exposed to a steam- or oxygen-bearing ambient to cause the implanted silicon atoms to react with oxygen atoms to form silicon dioxide within the gate dielectric. The silicon dioxide advantageously fills vacancy positions and terminates dangling bonds within the gate dielectric. A gate conductor is then deposited across the gate dielectric. The gate conductor may be, e.g., iridium, tungsten, or tungsten nitride. Select portions of the gate conductor, gate dielectric, and nitride layer may be etched to define a pair of opposed sidewall surfaces at the lateral boundaries of a gate stack. A lightly doped drain ("LDD") implant may then be performed to form LDD areas within the silicon-based substrate on opposite sides of the gate stack. Dielectric spacers comprising, e.g., nitride, may then be formed upon the opposed sidewall surfaces of the gate stack. A source/drain implant which is self-aligned to the opposed sidewall surfaces of the gate conductor may be forwarded into the substrate to form source/drain regions laterally spaced from the gate stack by LDD areas.

In an alternate embodiment, a gate dielectric is formed within a FLOTOX EEPROM memory device between a control gate and a floating gate. A tunnel dielectric comprising, e.g., silicon dioxide, is interposed between a silicon-based substrate and the floating gate comprising a conductive or semiconductive material. The gate dielectric comprises a metal oxide. Suitable metal oxides are listed above. The gate dielectric is CVD deposited across the floating gate. Silicon is then implanted into the gate dielectric using gas cluster ion beam implantation. The gate dielectric is heated while being exposed to steam or oxygen to convert the silicon to silicon dioxide. The silicon dioxide fills vacancy positions within the gate dielectric. Subsequently, the floating gate comprising a conductive or semiconductive material is formed across the gate dielectric. Portions of the tunnel dielectric, the floating gate, the gate dielectric, and the control gate may be removed to define a pair of opposed sidewall surfaces which encompass a gate stack. Dopants may then be implanted into exposed regions of the substrate to form source/drain region on opposite sides of the gate stack. A dielectric layer may be deposited across the resulting memory device to encapsulate the gate stack.

BRIEF DESCRIPTION OF THE DRAWINGS

Other objects and advantages of the invention will become apparent upon reading the following detailed description and upon reference to the accompanying drawings in which.

Figure 1:
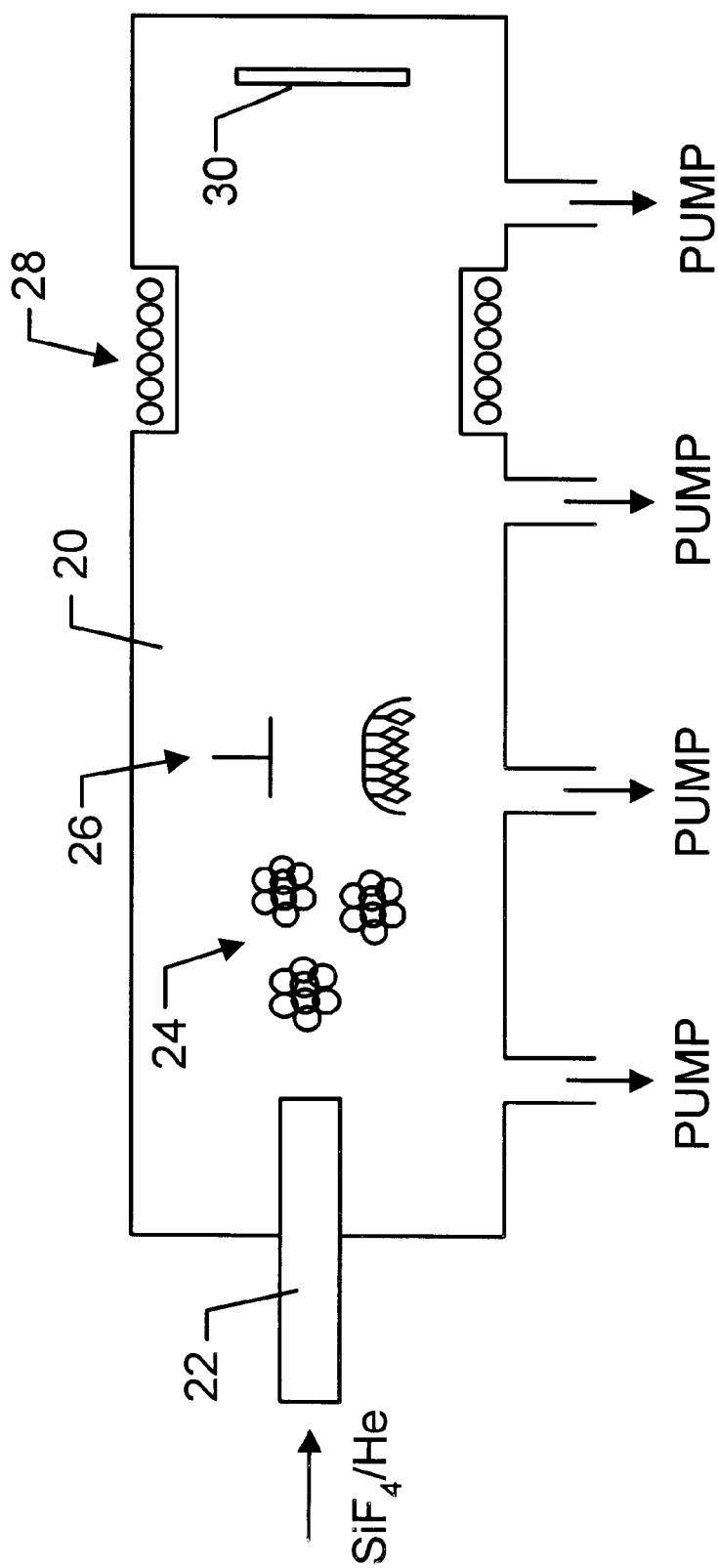
FIG. 1 depicts a side plan view of a cluster ion beam implantation system which may be used to implant atoms to a shallow depth.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a side plan view of a gas cluster ion beam implantation system which may be used to perform shallow implantation of species into a target. The system includes a super sonic adiabatic expansion nozzle 22. Nozzle 22 passes into an implantation chamber 20 which is maintained at a low pressure of less than about 100 milliTorr (i.e., vacuum regime). Although not shown, nozzle 22 tapers radially such that its inner diameter decreases in a direction toward the inner portion of implantation chamber 20. Several types of pumps, e.g., mechanical booster pumps, diffusion pumps, and turbo-molecular pumps, may be used to evacuate chamber 20. The implantation system also includes an ionizer 26 and an acceleration tube 28. The target 30 into which the ionic clusters are to be implanted is positioned on the opposite end of chamber 20 from nozzle 22 in preparation for the implantation process.

The implantation process involves passing a gas comprising the species to be implanted through nozzle 22 and into chamber 20. An inert gas, such as He may serve as the carrier gas. As shown, $SiF_4$ may be passed into nozzle 22 to provide for the implantation of Si atoms into target 30. As a result of being passed through nozzle 22, the gaseous molecules are supercooled, and thus become clusters of atoms 24, or collimated neutral cluster beams. Those clusters of atoms 24 are then ionized by electron bombardment within implantation chamber 20. Although not shown, a mass filter and a static lens system comprising several electrostatic field plates with small apertures may be positioned within chamber 20 between ionizer 26 and acceleration tube 28. The static lens system and the mass filter may be used to select particular sizes of the ionized clusters for implantation. Those ionized clusters chosen for implantation are electrostatically accelerated toward target 30 as they pass through acceleration tube 28 so that they gain energy. Upon striking target 30, the ionized clusters break up into individual atoms. The total energy of each ionized cluster is uniformly distributed across its corresponding atoms. As such, each atom has a low energy ranging from a few keV to hundreds of keV. The low energy of each atom entering target 30 allows the atoms to be implanted at a shallow depth of 1 to 100 Å below the topological surface of target 30. See, e.g., "Gas Cluster Ion Beam Processing For ULSI Fabrication", Yamada, I. and Matsuo, J., *Material Resources Society Symposium Proceedings,* Volume 427, pp. 265–274 (incorporated herein by reference) for a detailed description of gas cluster ion beam implantation.

Figure 2:
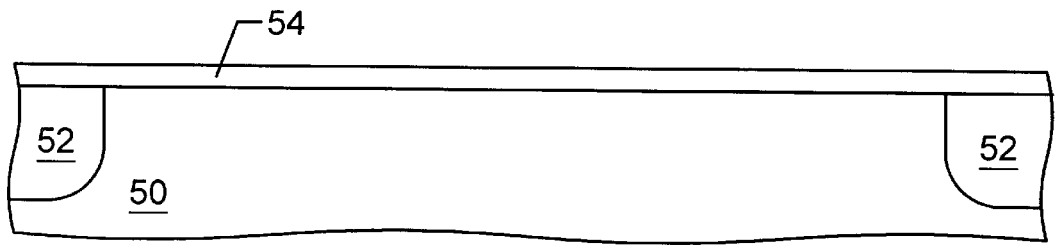
FIG. 2 depicts a partial cross-sectional view of a semiconductor topography according to one embodiment, wherein a nitride barrier layer is deposited across a silicon-based substrate, subsequent to the step in FIG. 1.

FIGS. 2–10 illustrate a sequence of fabrication steps according to one embodiment. Turning to FIG. 2, a partial cross-sectional view of a semiconductor substrate 50 is depicted. Substrate 50 comprises single crystalline silicon which has been slightly doped with n-type or p-type impurities. Trench isolation structures 52 are arranged a spaced distance apart within field regions of substrate 50. Trench isolation structures 52 serve to isolate ensuing active areas of substrate 50. Alternatively, trench isolation structures 52 may be replaced with LOCOS structures. A relatively thin nitride layer 54 (e.g., 8 Å thick) may be CVD deposited across substrate 50 using, e.g., remote plasma deposition or jet vapor deposition. Remote plasma deposition involves generating a plasma provided with, e.g., $SiH_4$ and $NH_3$, in a remote chamber which is separated from the deposition chamber in which the semiconductor wafer is placed. Only the species in the plasma (e.g., Si radicals and N radicals) which are required for the nitride deposition are passed from the remote chamber to the deposition chamber. Other species which may contaminate the semiconductor topography are thus inhibited from contacting the topography.

Jet vapor deposition involves passing a reactant gas, e.g., $SiH_4$ through a tube and creating a vacuum at one end of the tube so that a supersonic jet is formed within the tube. A plasma is created from another reactant gas, e.g., $N_2$, which is allowed to flow outside the tube. The semiconductor topography is scanned with the high velocity supersonic jet by either moving the jet or the wafer. As such, using jet vapor deposition affords uniform deposition of nitride across the substrate. The presence of nitride layer 54 upon substrate 50 serves as a diffusion barrier in that it is an amorphous film with minimum grain boundaries, if any, through which foreign species may pass. Nitride layer 54 therefore substantially inhibits metal atoms or dopants from passing from an ensuing overlying gate conductor into substrate 50 and hot carriers from passing from substrate 50 into an ensuing overlying gate conductor. Also, nitride layer 54 helps prevent oxidation of substrate 50 by providing a barrier to oxygen above the substrate. Forming nitride layer 54 across substrate 50 is preferred, but is not necessarily required.

Figure 3:
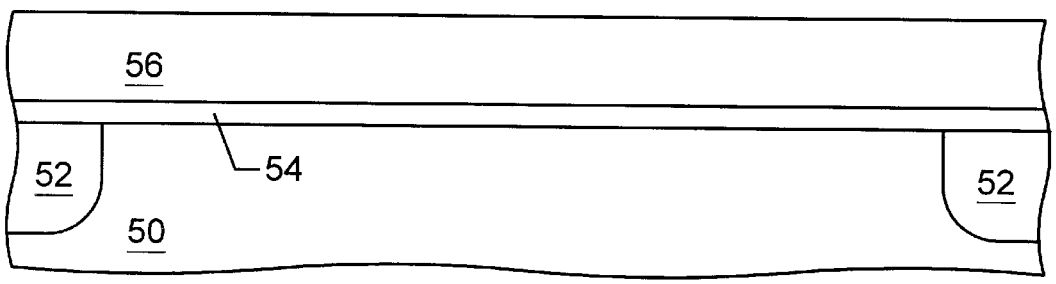
FIG. 3 depicts a partial cross-sectional view of the semiconductor topography, wherein a gate dielectric comprising metal oxide, e.g., $Ta_2O_5$, is CVD deposited across the nitride barrier layer, subsequent to the step in FIG. 2.

Turning to FIG. 3, a gate dielectric 56 comprising a metal oxide and having a K value greater than approximately 8.0 is then deposited across nitride layer 54. Preferably, dielectric 56 primarily comprises $Ta_2O_5$ which has a K value of approximately 22.0–25.0.

A 40 to 60 Å layer of $Ta_2O_5$ is preferably deposited using metal organic CVD ("MOCVD") from a gas comprising tantalum tetraethoxide dimethylamino ethoxide ("TAT-DMAE"). Alternatively, $Ta_2O_5$ may be deposited across the layer of nitride 84 using a reactive sputtering process. A conventional deposition furnace configured for TEOS deposition may be used to perform the MOCVD of TAT-DMAE. In-situ processing is preferably used to deposit both nitride layer 54 and gate dielectric 56 so that the topography is maintained under vacuum in the interim between the two deposition steps. That is, the deposition of nitride layer 54 and gate dielectric 56 may be performed in the same tool. In one instance, a cluster tool may be used which comprises multiple chambers in gaseous communication with each other. In this manner, the topography is prevented from being exposed to ambient contaminants during the in-situ processing. Alternatively, gate dielectric 56 may comprise other types of high K metal oxides. For example, gate dielectric 56 may comprise a metal oxide selected from the group consisting of tantalum pentoxide ($Ta_2O_5$), barium titanate ($BaTiO_3$), titanium oxide ($TiO_2$), zirconium oxide ($ZrO_2$), barium zirconate ($BaZrO_3$), barium tungstate ($BaWO_4$), magnesium dioxide ($MnO_2$), magnesium tungstate ($MnWO_4$), strontium niobate ($Sr_2Nb_2O_7$), tungsten trioxide ($WO_3$), zinc tungstate ($ZnWO_4$) yttrium sesqeioxide ($Y_2O_3$), strontium tungstate ($SrWO_4$), and strontium titanate ($SrTiO_3$).

Figure 4:
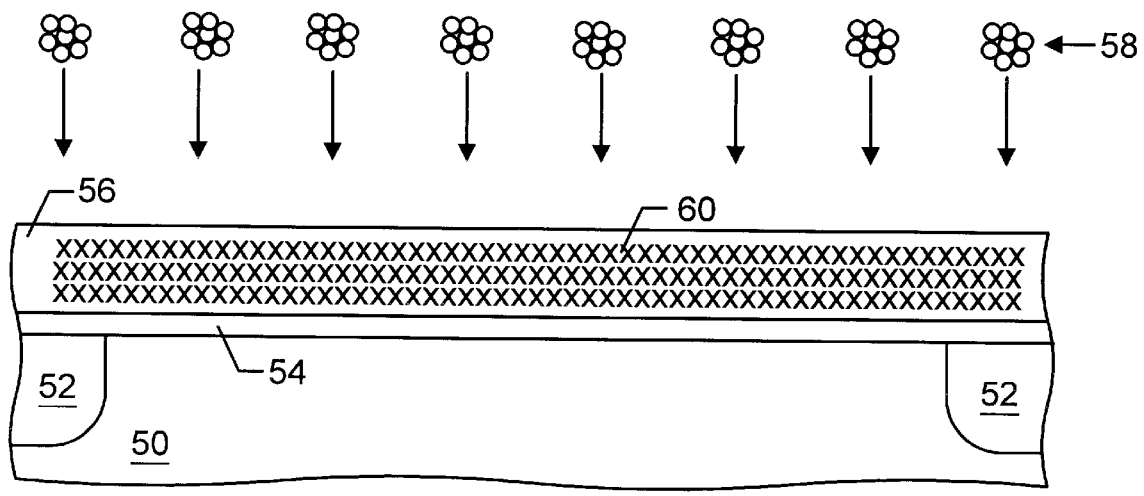
FIG. 4 depicts a partial cross-sectional view of the semiconductor topography, wherein clusters of Si atoms are implanted into the gate dielectric, subsequent to the step in FIG. 3.
Figure 5:
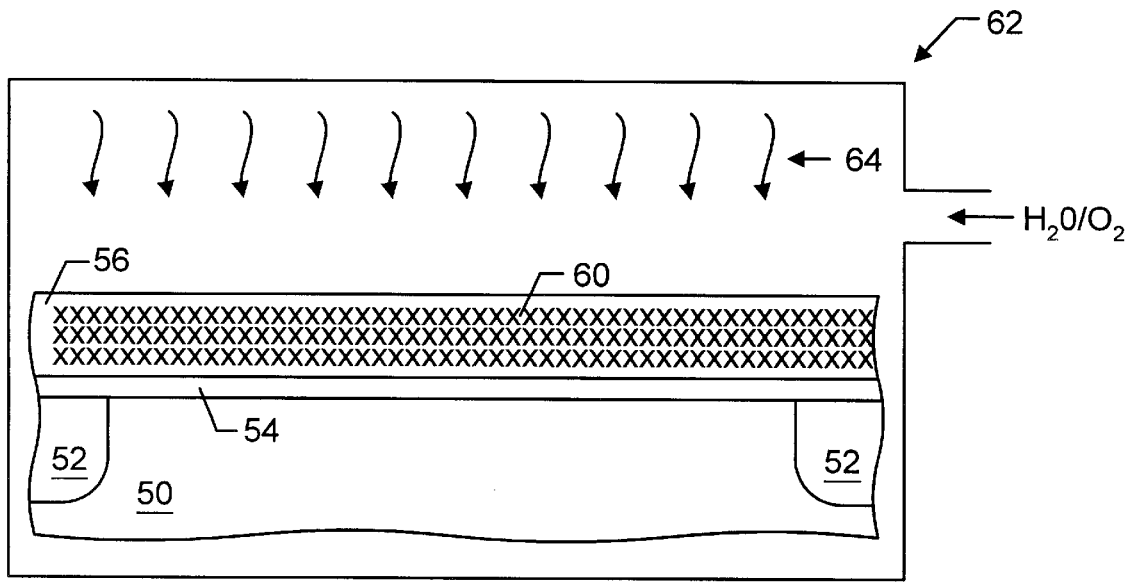
FIG. 5 depicts a partial cross-sectional view of the semiconductor topography, wherein the gate dielectric is annealed in a steam- or oxygen-bearing ambient to react the Si atoms with O atoms to form $SiO_2$ within vacancies of the gate dielectric, subsequent to the step in FIG. 4.

As shown in FIG. 4, clusters of silicon atoms 58 are then implanted into the semiconductor topography to a relatively shallow depth using the ion implantation system depicted in FIG. 1. In this manner, a peak concentration of silicon atoms may be placed primarily in the middle region 60 of gate dielectric 56 which is interposed between the upper and lower surfaces of the gate dielectric. In the case that gate dielectric 56 is a $Ta_2O_5$ layer which is about 40 to 60 Å thick, the target penetration of the silicon atoms into gate dielectric 56 is approximately 25 to 30 Å. It is to be understood that the higher the K value of gate dielectric 56, the thicker the gate dielectric needs to be to achieve the same capacitance. Turning to FIG. 5, the semiconductor topography is then annealed in a furnace 62 by subjecting the topography to thermal radiation 64. As the topography is being annealed, a steam- or oxygen- bearing ambient is passed into furnace 62. The topography may, e.g., be annealed at a temperature of 750° C. for approximately 30 minutes. As a result of the annealing process, Si atoms within gate dielectric 56 react with available O atoms to form $SiO_2$. It is believed that the $SiO_2$ fills O vacancies within gate dielectric 56 and terminates dangling bonds.

Figure 6:
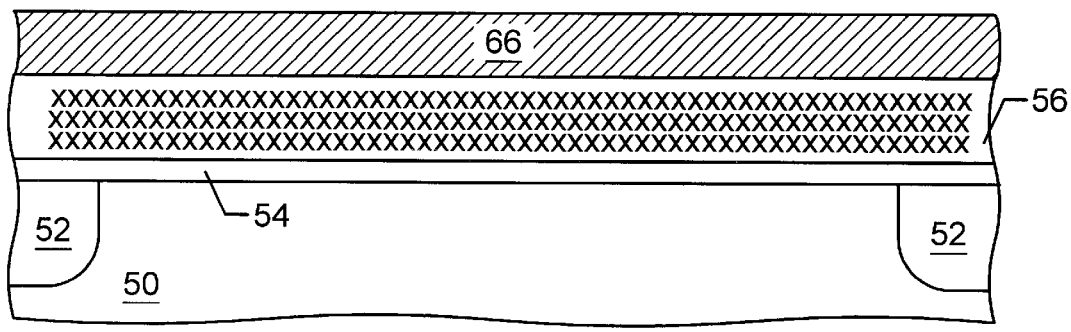
FIG. 6 depicts a partial cross-sectional view of a semiconductor topography, wherein a gate conductor is deposited across the gate dielectric, subsequent to the step in FIG. 5.
Figure 7:
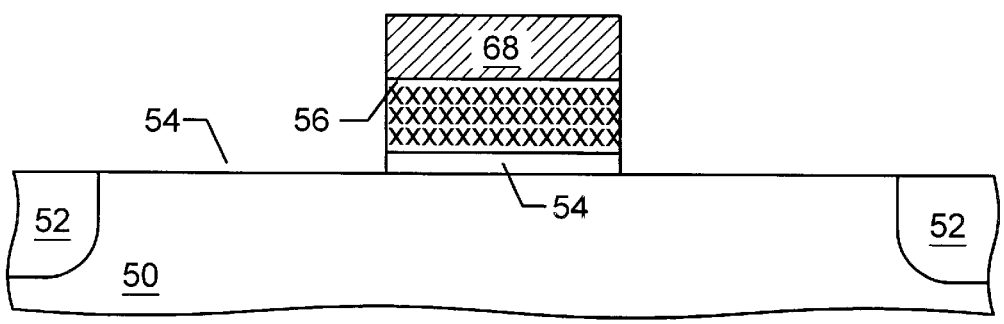
FIG. 7 depicts a partial cross-sectional view of a semiconductor topography, wherein portions of the nitride barrier layer, the gate dielectric, and the gate conductor are removed to define a pair of opposed sidewall surfaces for a gate stack, subsequent to the step in FIG. 6.

Subsequently, as shown in FIG. 6, a gate conductor material 66 is deposited across gate dielectric 56 using sputter deposition or MOCVD. Preferably, gate conductor material 66 comprises a conductive material, such as iridium, tungsten, or tungsten nitride. Gate conductor material 66 may alternatively comprise a semiconductive material, e.g., polysilicon, which is rendered conductive with dopants. Gate conductor material 66 could be subsequently exposed to higher temperatures without being concerned that dopants might migrate into substrate 50 if the gate conductor material is composed of a conductive material rather than a semiconductive material. FIG. 7 illustrates the removal of portions of nitride layer 54, gate dielectric 56, and gate conductor 68 from substrate 50. Those portions may be removed using optical lithography, followed by an etch technique, e.g., a plasma etch, to form a gate stack interposed between a pair of opposed sidewall surfaces.

Figure 8:
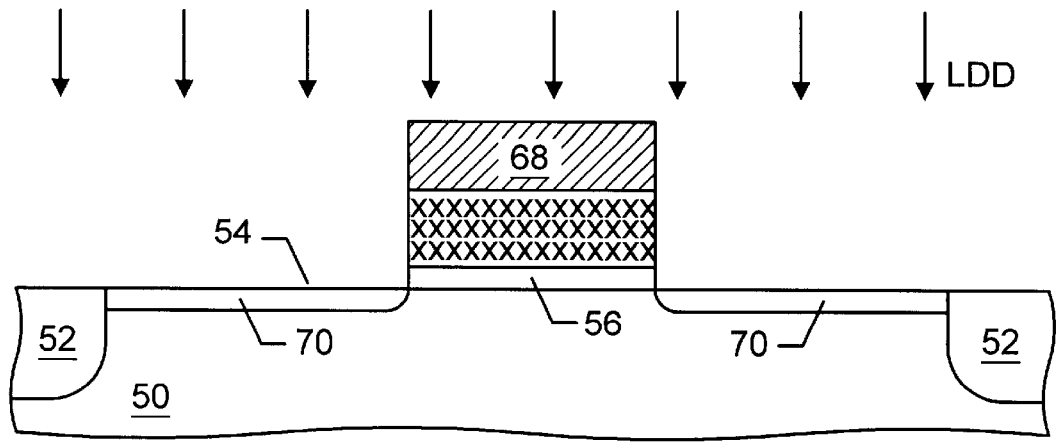
FIG. 8 depicts a partial cross-sectional view of the semiconductor topography, wherein an LDD implant is performed to form LDD areas laterally adjacent the gate stack, subsequent to the step in FIG. 7.
Figure 9:
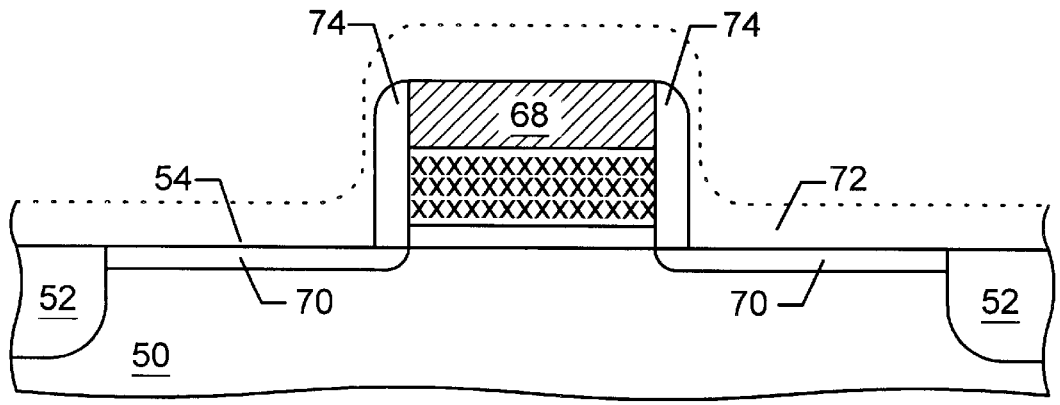
FIG. 9 depicts a partial cross-sectional view of the semiconductor topography, wherein dielectric sidewall spacers are formed upon the opposed sidewall surfaces of the gate stack, subsequent to the step in FIG. 8.

Turning to FIG. 8, an LDD implant dopant species is then forwarded into regions of substrate 50 not covered by the gate stack comprising gate dielectric 56. Some n-type dopant species that could be implanted are arsenic and phosphorus, and some p-type species that could be implanted are boron and boron difluoride. The formation of an NMOS transistor requires an LDD implant of n-type dopants, and the formation of a PMOS transistor requires an LDD implant of p-type dopants. In this manner, LDD areas 70 are formed within substrate 50 laterally adjacent the gate stack. As depicted in FIG. 9, dielectric sidewall spacers 74 may then be formed upon the opposed sidewall surfaces of the gate stack. Sidewall spacers 74 are formed by depositing a dielectric material 72 across the topography, followed by anisotropically etching the dielectric material at a faster rate in a vertical direction than in a horizontal direction. As a result of the anisotropic etch, the dielectric material is only retained upon the vertically oriented sidewall surfaces of the gate stack in the form of sidewall spacers 74.

Figure 10:
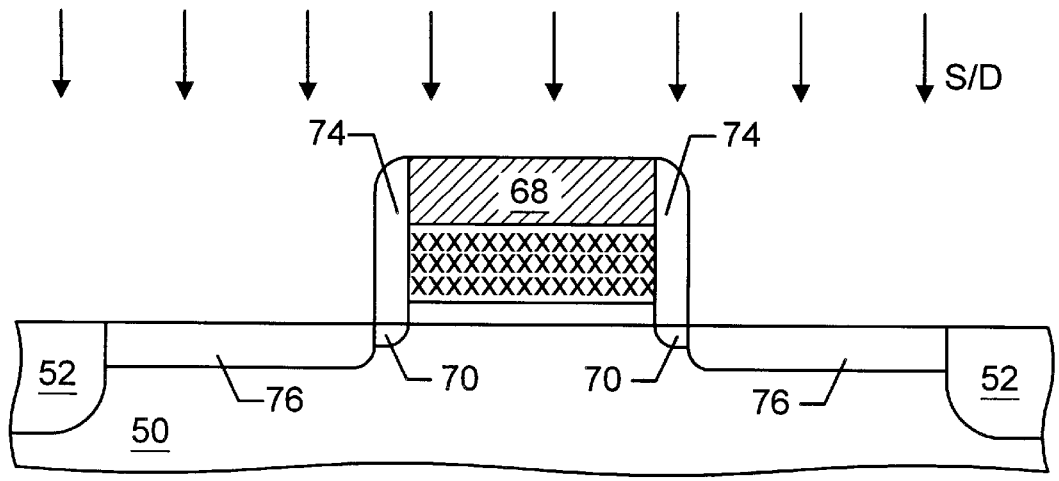
FIG. 10 depicts a partial cross-sectional view of the semiconductor topography, wherein a source/drain implant is performed to form source/drain regions laterally spaced from the gate stack, subsequent to the step in FIG. 9.

As shown in FIG. 10, a source/drain ("S/D") implant which is self-aligned to the exposed lateral edges of sidewall spacers 74 may then be performed to incorporate dopants into source/drain regions 76 of substrate 50. The S/D implant is performed at a higher energy and dose than the LDD implant. The dopants implanted during the S/D implant are the same type of dopants as those implanted during the LDD implant. Source/drain regions 76 and LDD areas 70 form graded junctions in which the dopant concentration increases in a lateral direction away from gate conductor 68. Post implant anneals may be performed to activate and position the as-implanted dopant species. In an alternate embodiment, LDD areas 70 and source/drain regions 76 may reside within a p-type or n-type well formed in substrate 50. Such well regions provide for the formation of a CMOS integrated circuit having both NMOS and PMOS transistors. In subsequent processing steps, conductive contacts may be formed through an interlevel dielectric down to the source/drain regions and the gate conductor. Interconnect routing may then be formed across the interlevel dielectric to electrically link together certain contacts.

Figure 11:
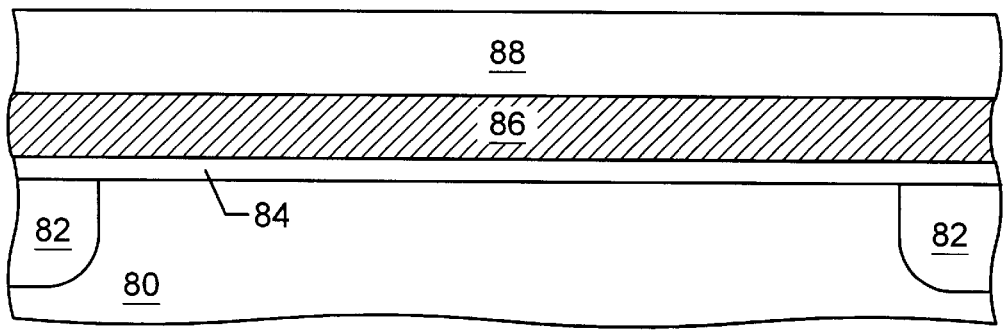
FIG. 11 depicts a partial cross-sectional view of a semiconductor topography according to another embodiment, wherein a gate dielectric comprising a metal oxide is CVD deposited across a floating gate which is spaced above a semiconductor substrate by a tunnel dielectric, subsequent to the step in FIG. 10.
Figure 12:
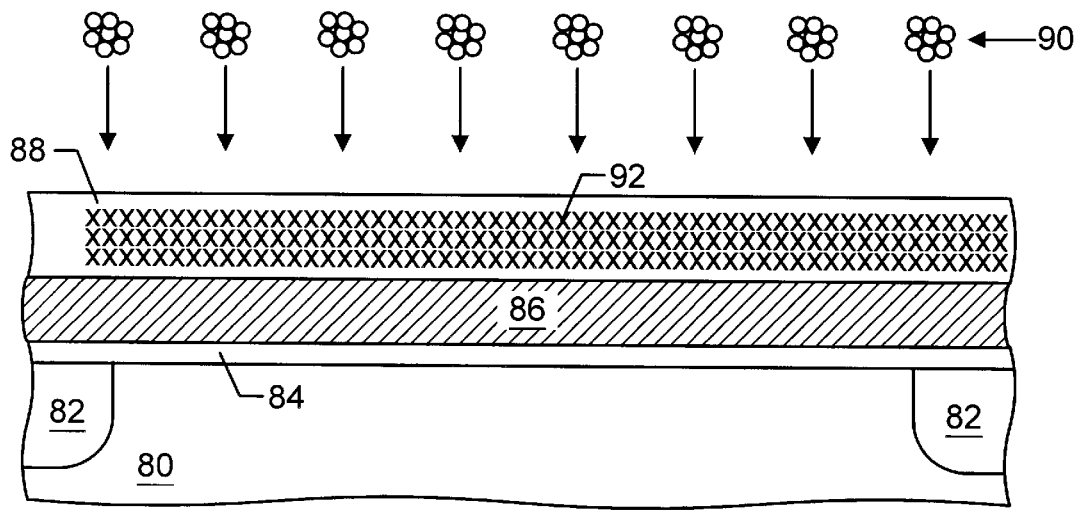
FIG. 12 depicts a partial cross-sectional view of the semiconductor topography, wherein clusters of Si atoms are implanted into the gate dielectric, subsequent to the step in FIG. 11.
Figure 13:
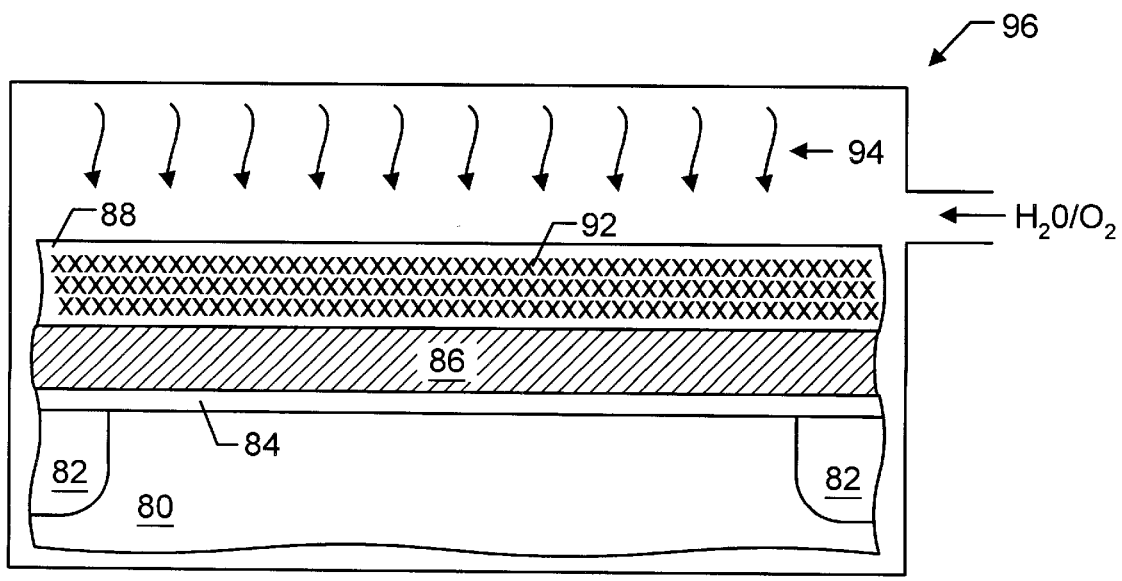
FIG. 13 depicts a partial cross-sectional view of the semiconductor topography, wherein the gate dielectric is annealed in a steam- or oxygen-bearing ambient to react the Si atoms with O atoms to form $SiO_2$ within vacancies of the gate dielectric, subsequent to the step in FIG. 12.

FIGS. 11–16 illustrate the semiconductor processing steps according to another embodiment of the invention in which an EEPROM memory device is formed. FIG. 11 depicts a semiconductor substrate 80 comprising single crystalline silicon. Trench isolation structures 82 are arranged spaced distances apart within substrate 80. A relatively thin tunnel dielectric comprising, e.g., silicon dioxide, is arranged across substrate 80. A floating gate 86 comprising, e.g., polysilicon, resides upon tunnel dielectric 84. A high K gate dielectric 88 comprising a metal oxide, e.g., $Ta_2O_5$, is deposited across floating gate 86 using, e.g., MOCVD. As shown in FIG. 12, clusters of silicon atoms 90 are then implanted into the middle region 92 of gate dielectric 88 using gas cluster ion beam implantation. Subsequently, as shown in FIG. 13, gate dielectric 88 is annealed in a furnace 96 at a temperature of about 700 to 850° C. for about 30 minutes. During the anneal step, steam or oxygen is passed into furnace 96. As a result of being annealed, the implanted Si atoms react with O atoms of gate dielectric 88 to form $SiO_2$. The $SiO_2$ may fill vacancies and terminate dangling bonds within gate dielectric 88.

Figure 14:
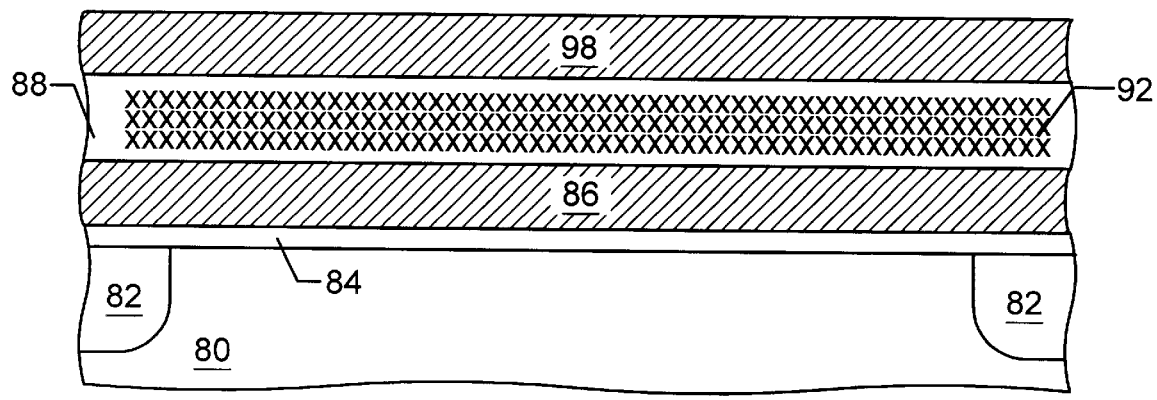
FIG. 14 depicts a partial cross-sectional view of the semiconductor topography, wherein a control gate is deposited across the gate dielectric, subsequent to the step in FIG. 13.
Figure 15:
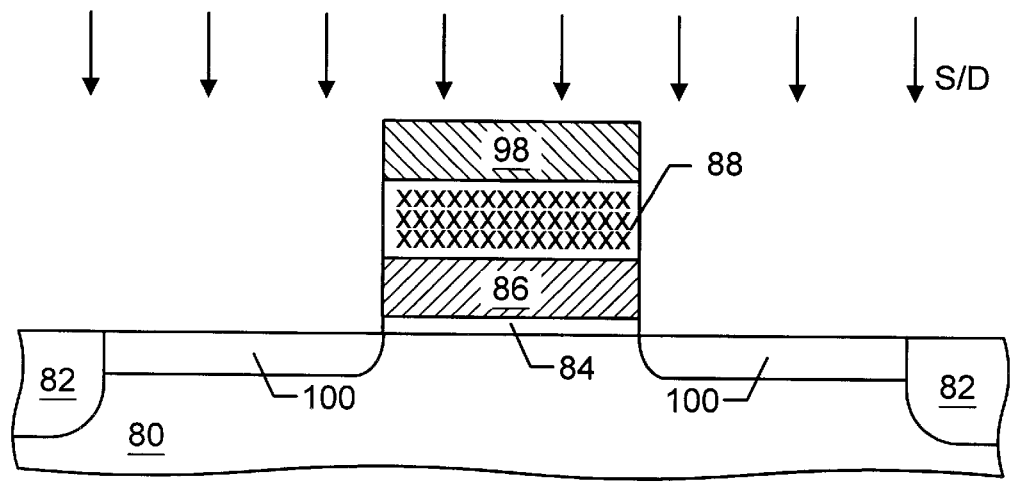
FIG. 15 depicts a partial cross-sectional view of the semiconductor topography, wherein portions of the tunnel dielectric, the floating gate, the gate dielectric, and the poly gate are removed to define a gate stack, and wherein a source/drain implant is performed to form source/drain regions within the substrate laterally adjacent the gate stack, subsequent to the step in FIG. 14.
Figure 16:
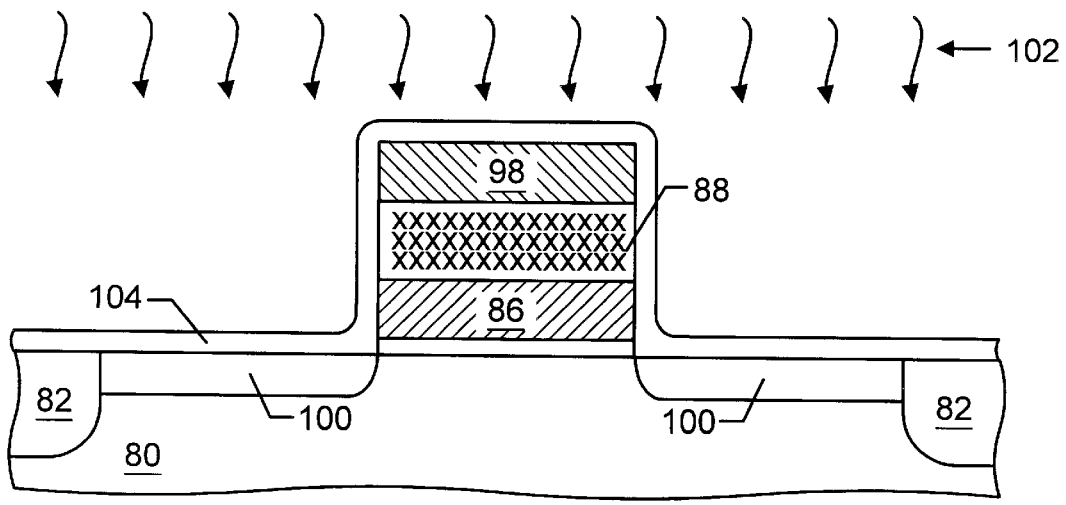
FIG. 16 depicts a partial cross-sectional view of the semiconductor topography, wherein a dielectric layer is formed across the topography and the substrate is annealed, resulting in lateral migration of the source/drain regions, subsequent to the step in FIG. 15.

Turning to FIG. 14, a control gate 98 is formed across gate dielectric 88 using CVD of, e.g., polysilicon. Dopants may be ion implanted into polysilicon control gate 88 to lower its resistivity. As shown in FIG. 15, portions of tunnel dielectric 84, floating gate 86, gate dielectric 88, and control gate 98 may then be removed to form a stacked gate structure defined between a pair of opposed sidewall surfaces. Removal of those portions may be accomplished using optical lithography and a plasma etch which is terminated before substantial portions of the surface of substrate 80 can be removed. A heavy concentration S/D implant is self-aligned to the exposed sidewall surfaces of the stacked gate structure to form source/drain regions 100 within substrate 80. The source/drain regions are preferably implanted with dopants that are opposite in type to the dopants residing within the bulk of substrate 80. FIG. 16 illustrates a dielectric layer 104 being formed across the semiconductor topography. Dielectric layer 104 may be CVD deposited or thermally grown by exposing the topography to thermal radiation 102 and to ambient oxygen. Thermal radiation 102 also causes migration of dopants within source/drain regions 100 such that they partially extend under tunnel dielectric 84. The resulting non-volatile memory device includes a tunnel dielectric 84, a floating gate 86, a gate dielectric 88, and a control gate 98. A bit line conductor may be subsequently coupled to the drain region, and a word line conductor may be coupled to the control.

It will be appreciated to those skilled in the art having the benefit of this disclosure that this invention is believed to provide a method for incorporating silicon atoms into a gate dielectric using gas cluster ion beam implantation and for converting the silicon atoms into silicon dioxide to enhance the properties of the gate dielectric. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
    forming a metal oxide layer above a semiconductor substrate;
    supercooling a gas comprising silicon atoms to form a cluster of silicon atoms; and
    implanting the cluster of silicon atoms into the metal oxide layer.

2. The method of claim 1, wherein the metal oxide layer comprises a dielectric selected from the group consisting of tantalum pentoxide, titanium oxide, zirconium oxide, barium titanate, barium zirconate, barium tungstate, magnesium dioxide, strontium niobate, tungsten trioxide, zinc tungstate, yttrium sesqeioxide, strontium tungstate, and strontium titanate.

3. The method of claim 1, further comprising annealing the metal oxide layer while exposing it to steam or oxygen to form silicon oxide within the metal oxide layer.

4. The method of claim 1, wherein said supercooling a gas comprises passing the gas through a nozzle into a vacuum region of less than about 100 milliTorr.

5. The method of claim 1, wherein said implanting the cluster of silicon atoms comprises:
    ionizing the cluster of silicon atoms; and
    accelerating the cluster of silicon atoms in an electric field such that the cluster of silicon atoms are forwarded to the metal oxide layer.

6. The method of claim 5, wherein the cluster of silicon atoms separate into individual silicon atoms which share a total energy of the cluster of silicon atoms when the cluster of silicon atoms pass into the metal oxide layer.

7. The method of claim 1, further comprising depositing silicon nitride across the semiconductor substrate prior to said forming a metal oxide layer.

8. The method of claim 7, wherein the metal oxide layer comprises a thickness of approximately 40 to 60 Å, and wherein the silicon atoms are implanted to a depth of approximately 25 to 30 Å below an upper surface of the metal oxide layer.

9. The method of claim 1, further comprising depositing a gate conductor across the metal oxide layer subsequent to said forming a metal oxide layer.

10. The method of claim 9, wherein the gate conductor comprises a material selected from the group consisting of polysilicon, iridium, tungsten, and tungsten nitride.

11. The method of claim 9, further comprising etching away select portions of the metal oxide layer and the gate conductor from the semiconductor substrate.

12. The method of claim 11, further comprising:
    implanting a first concentration of dopant into areas of the semiconductor substrate exclusive of underneath the gate conductor to form lightly doped drain areas therein;
    forming a pair of dielectric spacers extending laterally from opposed sidewall surfaces of the gate dielectric; and
    implanting a second concentration of dopant substantially greater than the first concentration of dopant into source and drain regions of the semiconductor substrate spaced laterally from the gate dielectric by the pair of dielectric spacers.

13. The method of claim 12, wherein the pair of dielectric spacers comprise silicon nitride.

14. The method of claim 1, further comprising:
    forming a tunnel dielectric across the semiconductor substrate; and
    depositing a first gate conductor across the tunnel dielectric prior to said forming a metal oxide layer above a semiconductor substrate.

15. The method of claim 14, further comprising:
    depositing a second gate conductor across the metal oxide layer subsequent to said forming a metal oxide layer;
    etching select portions of the tunnel dielectric, the first gate conductor, the metal oxide layer, and the second gate conductor to expose source and drain regions of the semiconductor substrate; and
    implant dopant species into the source and drain regions.

* * * * *